United States Patent [19]
Saida et al.

[11] Patent Number: 5,866,930
[45] Date of Patent: Feb. 2, 1999

[54] SEMICONDUCTOR DEVICE AND METHOD OF MANUFACTURING THE SAME

[75] Inventors: Shigehiko Saida; Yoshio Ozawa, both of Yokohama, Japan

[73] Assignee: Kabushiki Kaisha Toshiba, Kawasaki, Japan

[21] Appl. No.: 697,448

[22] Filed: Aug. 23, 1996

[30] Foreign Application Priority Data

Aug. 25, 1995 [JP] Japan ................................. 7-217881

[51] Int. Cl.$^6$ .............................................. H01L 29/788
[52] U.S. Cl. ........................... 257/316; 257/52; 257/756
[58] Field of Search ................................... 257/315, 316, 257/396, 320, 397, 321, 52, 75, 754, 756; 437/40

[56] References Cited

U.S. PATENT DOCUMENTS

| | | | |
|---|---|---|---|
| 3,936,859 | 2/1976 | Dingwall | 257/396 |
| 4,755,865 | 7/1988 | Wilson et al. | 357/63 |
| 5,177,569 | 1/1993 | Koyama et al. | 257/412 |
| 5,229,631 | 7/1993 | Woo | 257/316 |
| 5,441,904 | 8/1995 | Kim et al. | 437/40 |
| 5,481,128 | 1/1996 | Hong | 257/320 |
| 5,501,744 | 3/1996 | Albright et al. | 136/258 |
| 5,557,122 | 9/1996 | Shrivastava et al. | 257/316 |
| 5,665,981 | 9/1997 | Banerjee | 257/66 |

FOREIGN PATENT DOCUMENTS

| | | |
|---|---|---|
| 62-145872 | 6/1987 | Japan . |
| 64-14968 | 1/1989 | Japan . |
| 64-33973 | 2/1989 | Japan . |
| 64-37876 | 2/1989 | Japan . |
| 4-25176 | 1/1992 | Japan . |
| 4-287929 | 10/1992 | Japan . |
| 6-37329 | 2/1994 | Japan . |

OTHER PUBLICATIONS

E.F. Kennedy, et al. "Influence of $^{16}$O, $^{12}$C, $^{14}$N, and Noble Gases on the Crystallization of Amorphous Si Layers", Journal of Applied Physics, vol. 48, No. 10, (pp. 4241–4246), Oct. 1977.

Primary Examiner—Sara W. Crane
Attorney, Agent, or Firm—Oblon, Spivak, McClelland, Maier & Neustadt, P.C.

[57] ABSTRACT

A semiconductor device comprises a first conducting layer, a first insulating layer formed on the first conducting layer, a second conducting layer formed on the first insulating layer and facing the first conducting layer, wherein, at least part of a peripheral portion of the region of at least one of the first and second conducting layers, in contact with the first insulating layer, includes an amorphous conducting layer made of a semiconductor, and the amorphous conducting layer contains at least one element selected from the group consisting of oxygen, nitrogen, carbon, argon, chlorine, and fluorine and a total concentration of the at least one element falls within the range from 0.1 atomic % to 20 atomic %.

20 Claims, 11 Drawing Sheets

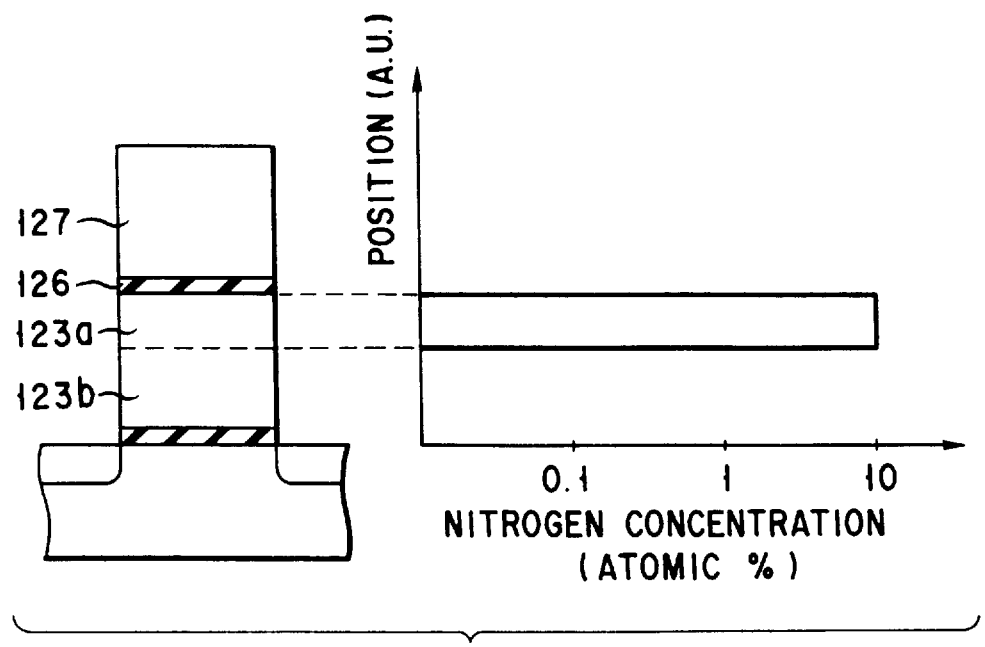
F I G. 10A
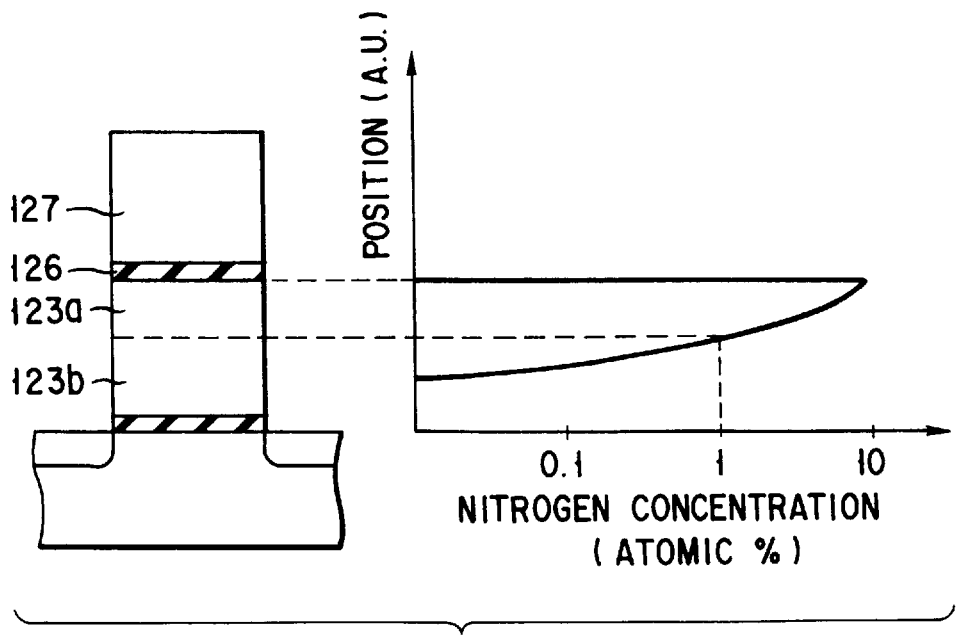
F I G. 10B

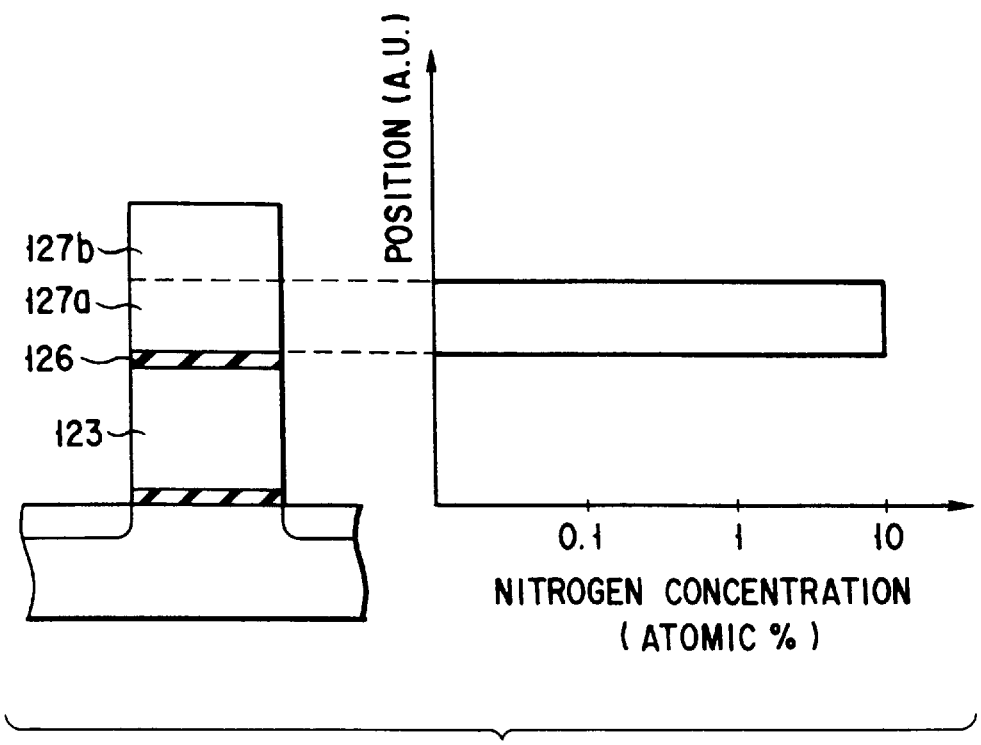
F I G. 10C
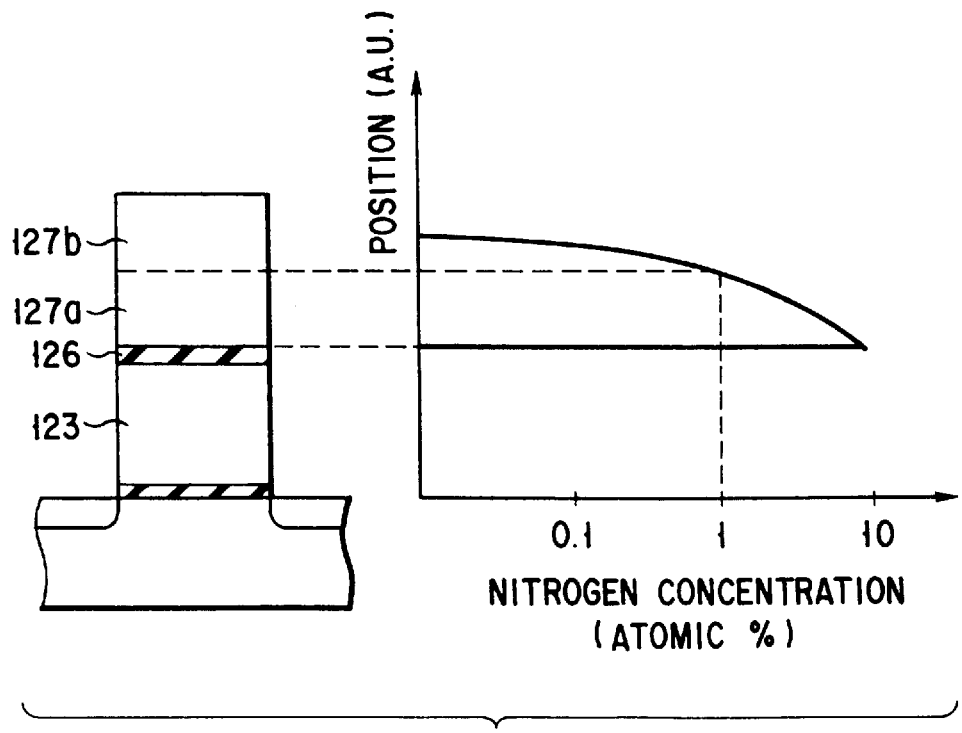
F I G. 10D

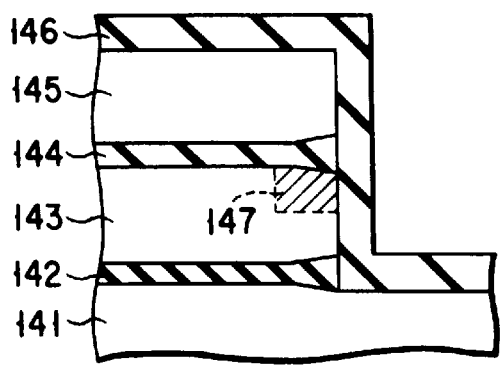
F I G. 16A
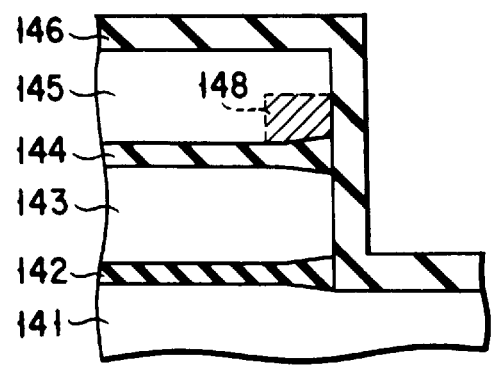
F I G. 16B
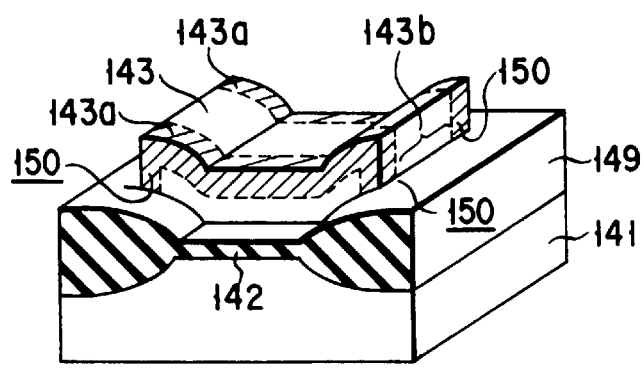
F I G. 17A
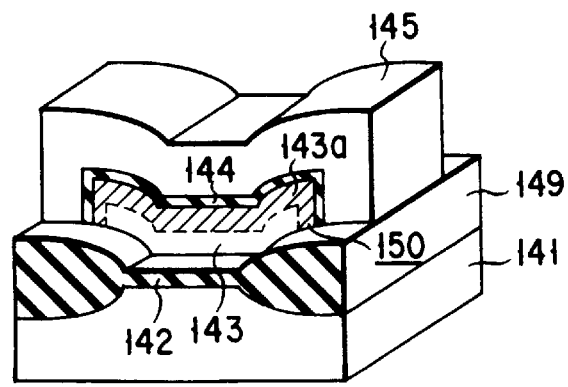
F I G. 17B

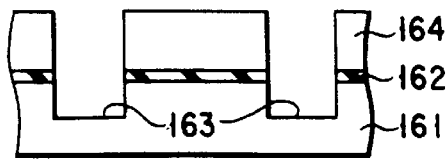
F I G. 20A
F I G. 21A
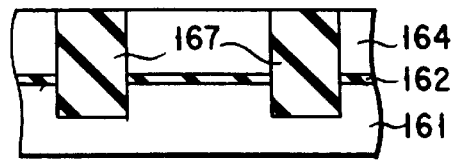
F I G. 20B
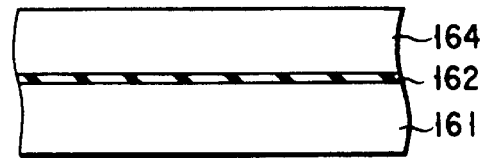
F I G. 21B
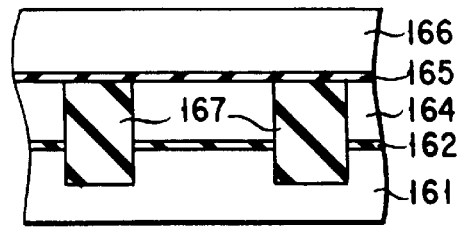
F I G. 20C
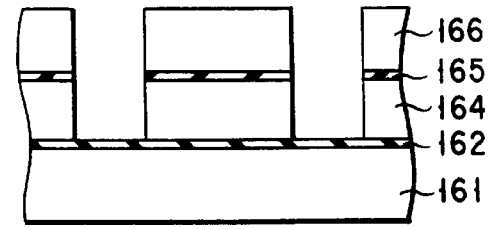
F I G. 21C
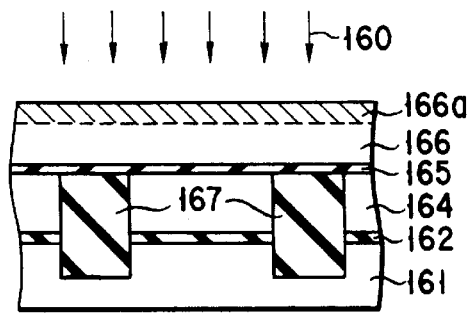
F I G. 20D
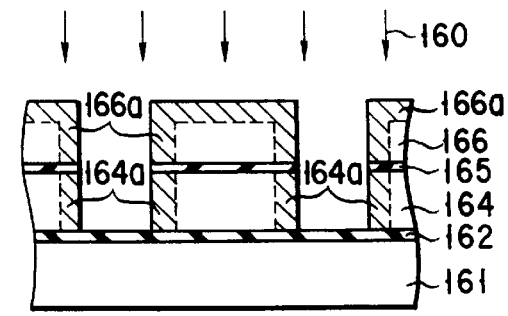
F I G. 21D
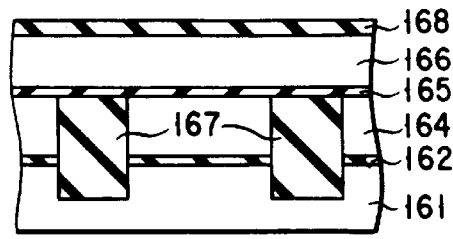
F I G. 20E
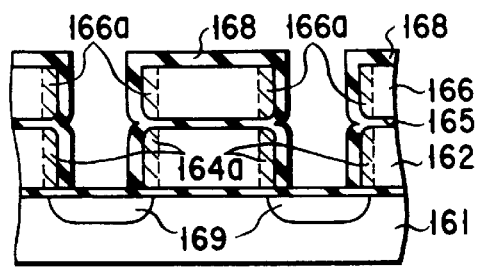
F I G. 21E

SEMICONDUCTOR DEVICE AND METHOD OF MANUFACTURING THE SAME

BACKGROUND OF THE INVENTION

1. Field of the Invention

The present invention relates to a semiconductor device having first and second conducting layers facing each other with an insulating layer interposed therebetween, and to a method of manufacturing the same.

2. Description of the Related Art

Hitherto, as memory devices of information processing apparatuses, magnetic disk devices have been widely used. However, the magnetic disk devices have the following drawbacks. First, they are easily affected by shock because they have a highly precise mechanical driving means. Second, the magnetic disk devices cannot access a storage media at a high speed because their access means to the storage media is mechanical one.

Recently, as the memory device of an information processing apparatus, the development of semiconductor memory devices has been made. The semiconductor memory devices do not have a mechanical driving means. Therefore, they have a high shock resistance and a high access speed.

Now, in an EEPROM (Electrically Erasable Programmable Read Only Memory), one of nonvolatile semiconductor memory devices, polycrystalline silicon doped with impurities having 3 or 5 valences is used as a material for floating gate electrodes and control gate electrodes, in consideration of productivity and stability of the interface between the gate electrodes and an underlying insulating film in a high-temperature heat treatment step performed later in a manufacturing process.

However, in the case where the polycrystalline silicon film is used as a floating gate, the following problem is accompanied. That is, as an insulating film between gate electrodes (a floating gate electrode and a control gate electrode) is decreased in thickness, the defect density of the insulating film between the gate electrodes increases. This problem constitutes a bar to miniaturization (high integration) of EEPROM and operation of EEPROM at low voltage.

To solve the problem, it is considered to use a single crystalline silicon film as a floating gate electrode. As a method of forming the single crystalline silicon film, known is the one disclosed in Jpn. Pat. Appln. KOKAI Publication No. 3-196673 in which an amorphous silicon film is crystallized into a single crystalline silicon film.

In this method, at first, a seed region for single crystallization is first formed. Second, on the seed region, an amorphous silicon film is deposited. Third, to the amorphous silicon film, impurities are doped by an ion implantation method and the like. Finally, the amorphous silicon film is crystallized into a single crystalline film by a solid phase growth of the lateral direction or by laser annealing.

However, this method requires additional steps such as a seed region formation step, an annealing step for crystallization, unlike the case where a polycrystalline silicon film is employed as a floating gate electrode. Therefore, this method is complicated in manufacturing steps.

SUMMARY OF THE INVENTION

An object of the present invention is to provide a semiconductor device having first and second conducting layers facing each other with an insulating layer interposed therebetween, and also a method of manufacturing the same. The semiconductor device is characterized in that even if the thickness of the insulating film is reduced, an increase of the defect density of the insulating film can be suppressed.

To attain the aforementioned object, the semiconductor device according to a first aspect of the present invention comprises:

a first conducting layer;

a first insulating layer formed on the first conducting layer;

a second conducting layer formed on the first insulating layer and facing the first conducting layer;

wherein, at least part of a peripheral portion of the region of at least one of the first and the second conducting layer, in contact with the first insulating layer, includes an amorphous conducting layer made of a semiconductor; and the amorphous conducting layer contains at least one element selected from the group consisting of oxygen, nitrogen, carbon, argon, chlorine, and fluorine and a total concentration of the at least one element falls within the range from 0.1 atomic % to 20 atomic %.

It is more preferable that the concentration of the at least one element fall within the range between 1 atomic % and 10 atomic %.

The peripheral portion of the region of the first conducting layer in contact with the first insulating layer may include the amorphous conducting layer.

The peripheral portion of the region of the second conducting layer in contact with the first insulating layer may include the amorphous conducting layer.

The peripheral portions of the regions of the first and the second conducting layer in contact with the first insulating layer may include the amorphous conducting layer.

The semiconductor device may further comprise a third conducting layer formed on the second conducting layer, wherein the third conducting layer is formed of one of a refractory metal and a silicide thereof.

The semiconductor is preferably silicon and the at least one of the first and the second conducting layer is formed of silicon.

The semiconductor device may further comprises:

a semiconductor substrate on which the first conducting layer is formed;

second insulating layers for element isolation formed on both sides of the first conducting layer on the semiconductor substrate so as to sandwich the first conducting layer in one direction; and fourth conducting layers formed on both sides of the first conducting layer on the semiconductor substrate so as to sandwich the first conducting layer in a direction crossing the one direction where the second insulating layers sandwich the first conducting layer;

wherein the amorphous conducting layer is included in a region on both sides of at least one of the first and the second conducting layer in a direction where the fourth conducting layers sandwich the first conducting layer and in contact with the first insulating layer.

The second insulating layers may be buried in trenches formed in the semiconductor substrate, respectively.

The first insulating layer may include portions extending to side walls of the first conducting layer and in contact with the second insulating layers, and wherein the second conducting layer includes portions extending to the side walls of the first conducting layer with the portions of the first insulating layer extending to the side walls of the first conducting layer interposed therebetween and in contact with the second insulating layers.

The first conducting layer may be used as a floating gate electrode and the second conducting layer may be used as a control gate electrode.

The method of manufacturing the semiconductor device according to the first aspect of the present invention comprises the steps of:

forming a first conducting layer on a semiconductor substrate;

forming a first insulating layer on the first conducting layer;

forming a second conducting layer on the first insulating layer; and etching the first conducting layer, first insulating layer and second conducting layer in a predetermined form;

wherein at least one of the steps of forming the first and the second conducting layer comprises a step of forming at least one of the first and the second conducting layers by use of a raw material containing at least one element selected from the group consisting of oxygen, nitrogen, carbon, argon, chlorine and fluorine; and at least one of the first and the second conducting layer is formed in such a way that at least part of a peripheral portion in contact with the first insulating layer includes an amorphous conducting layer made of a semiconductor having the at least one element in a total concentration ranging from 0.1 atomic % to 20 atomic %.

The step of forming at least one of the first and the second conducting layer can be performed by a CVD (Chemical Vapor Deposition) method or an ion implantation method.

The method of manufacturing the semiconductor device according to the first aspect of the present invention may further comprise a step of doping impurities having one conductivity type into the substrate by using the second conducting layer as a mask by use of the ion implantation, to form a diffusion layer on both sides of the first conducting layer on the semiconductor substrate, followed by activating the impurities present in the diffusion layer while an amorphous structure of the amorphous layer is maintained by heat treatment, after the step of etching the first conducting layer, first insulating layer and second conducting layer in a predetermined form.

The method of manufacturing the semiconductor device according to the first aspect of the present invention may further comprise a step of thermal oxidation to oxidize regions of the first and the second conducting layer which are located on both sides thereof in a direction where the diffusion layers sandwich the first conducting layer and contact the first insulating layer, after the step of etching the first conducting layer, first insulating layer and second conducting layer in a predetermined form.

The semiconductor is preferably silicon, and the at least one of the first and the second conducting layer is formed of silicon.

The semiconductor device according to a second aspect of the present invention comprises:

a first conducting layer;

a first insulating layer formed on the first conducting layer; and a second conducting layer formed on the first insulating layer and facing the first conducting layer, wherein, at least one conducting layer of the first and the second conducting layer is formed of a polycrystalline conducting layer; and at least part of a peripheral portion of the at least one conducting layer, which is a region facing the other conducting layer and in contact with the first insulating layer, contains a polycrystalline structure having an average grain diameter smaller than the average grain diameter of the other region.

The region may be included in the first conducting layer in contact with the first insulating layer and contain a polycrystalline structure having an average grain diameter smaller than that of the other region.

The region may be included in the second conducting layer in contact with the first insulating layer and contain a polycrystalline structure having an average grain diameter smaller than that of the other region.

The region may be included in each of the first and the second conducting layer in contact with the first insulating layer and contain a polycrystalline structure having an average grain diameter smaller than that of the other region.

The semiconductor device further comprises a third conducting layer formed on the second conducting layer, wherein the third conducting layer is formed of one of a refractory metal and a silicide thereof.

The semiconductor device may further comprise:

a semiconductor substrate on which the first conducting layer is formed;

second insulating layers for element isolation formed on both sides of the first conducting layer on the semiconductor substrate so as to sandwich the first conducting layer in one direction; and fourth conducting layers formed on both sides of the first conducting layer on the semiconductor substrate so as to sandwich the first conducting layer in a direction crossing the one direction where the second insulating layer sandwich the first conducting layer;

wherein the polycrystalline structure is included in a region on both sides of at least one of the first and the second conducting layer in a direction where the fourth conducting layers sandwich the first conducting layer and in contact with the first insulating layer.

The second insulating layers may be buried in trenches formed in the semiconductor substrate, respectively.

The first insulating layer may include portions extending to side walls of the first conducting layer and in contact with the second insulating layers, and wherein the second conducting layer includes portions extending to the side walls of the first conducting layer with the portions of the first insulating layer extending to the side walls of the first conducting layer interposed therebetween and in contact with the second insulating layers.

The first conducting layer may be used as a floating gate electrode and the second conducting layer may be used as a control gate electrode.

The value of the smaller average diameter is desired to be a half or less of the thickness of at least one of the first and second conducting layers.

The method of manufacturing the semiconductor device according to a second aspect of the present invention comprises the steps of:

forming a first conducting layer on a substrate;

forming an insulating layer on the first conducting layer;

forming a second conducting layer on the insulating layer;

forming a stacked body by etching the first conducting layer, insulating layer, and second conducting layer in a predetermined form; and applying heat treatment to the stacked body after the step of forming a stacked body;

wherein at least one of the first and the second conducting layer is formed of polycrystalline conducting layer containing impurities, and the step of applying heat treatment comprises a step of out-diffusing the impurities to grow crystals having grain diameters smaller than that of the other region, at part of the peripheral portion of at least one of the first and the second conducting layer.

Another method of manufacturing the semiconductor device according to the second aspect of the present invention comprises the steps of:

forming a first conducting layer on a substrate;

forming an insulating layer on the first conducting layer;

forming a second conducting layer on the insulating layer;

forming a stacked body by etching the first conducting layer, insulating layer, and second conducting layer in a predetermined form;

forming an oxygen-doped region on the side surface of the stacked body by implanting oxygen ions diagonally into the stacked body; and applying heat treatment after the step of implanting oxygen ions into the oxygen-doped region to grow crystal grains having diameters smaller than those of the other region.

The present inventors conducted studies on a main cause of the phenomenon that the defect density of the insulating film between the gate electrodes increases with a decrease of thickness of the insulating film, when a floating gate electrode is formed of a polycrystalline silicon film. As a result, they found that the main cause is bird's beak oxidation which takes place in an oxidation step performed after a floating gate electrode and a control gate electrode are processed in a self aligning manner (hereinafter, this step will be referred to as "post gate-formation oxidation step").

To be more specific, as shown in FIG. 1, in the post gate-formation oxidation step, an oxidizing agent is diffused through a post gate-formation oxidation film 91 and fed to an insulating film 94, that is, the peripheral portion of the region sandwiched between a floating gate electrode 92 and a control gate electrode 93. By this, the polycrystalline silicon film serving as the floating gate electrode 92 is oxidized to form bird's beaks 95.

At this point, a stress is produced in the grain boundary of the polycrystalline silicon film, as a result of volume expansion accompanied by the oxidation. Then, to mitigate the stress, another stress is applied to the grains of the polycrystalline silicon. Consequently, the polycrystalline silicon grains are grown into protruding type grains, producing protrusions 96 on the peripheral polycrystalline silicon film.

Because of the protrusions 96, the peripheral insulating film 94 between the gate electrodes gets thin. In addition, the insulating film 94 is influenced by the stress of the protrusions. Because of the reduction in thickness of the insulating layer and the generation of stress, the defect density of the insulating film 94 increases.

Such high defect density will bring breakage of the insulating film. In fact, it has been confirmed that breakage took place in the peripheral portion of the insulating film. Incidentally, in FIG. 1, reference numerals 97, 98 and 99 indicate a silicon substrate, diffusion layer, and gate insulating film, respectively.

In the first aspect of the present invention, at least part of the peripheral portion of the first conducting layer, second conducting layer, or the first and second conducting layers, facing the region sandwiched between the first and second conducting layers is an amorphous conducting layer.

Since there is no grain boundary in the amorphous conducting layer, the grains will not grow into protruding type grains in the post gate-formation oxidation step. Accordingly, the insulating film will not be reduced in thickness and therefore the defect density of the insulating film will not increase.

In the present invention, the amorphous conducting layer has one or two or more elements selected from the group consisting of oxygen, nitrogen, carbon, argon, chlorine, and fluorine and the overall concentration of the one or two or more elements falls within the range of 0.1 atomic % to 20 atomic %.

This is defined based on the finding that if the overall concentration of the aforementioned elements is 0.1 atomic % or more, the crystallization temperature of the amorphous conducting layer abruptly increases, effectively preventing the amorphous conducting layer from being crystallized in a later step. Desirably, the overall concentration is 1 atomic % or more. For a better understanding of this matter, FIG. 2 is given showing the relationship between the nitrogen concentration and the crystallization temperature by annealing performed in a non-oxidative atmosphere with respect to the amorphous silicon film. The same results were obtained even if an element other than nitrogen element or two or more kinds of element are used.

The reason why the uppermost concentration of the elements is set to 20 atomic % is that if the concentration exceeds 20 atomic %, an electron carrier concentration reduces, turning the amorphous conducting layer to a depletion state, with the result that a capacitor consisting of the first and second conducting layers and an insulating layer therebetween is reduced in its capacitance. Desirably, the concentration is set to 10 atomic % or less. For a better understanding of this matter, FIG. 3 is given showing the relationship between the nitrogen concentration and the electron carrier concentration with respect to amorphous silicon film. The same results were obtained even if an element other than nitrogen or two or more kinds of element are used.

In order to adjust the reduction level of the capacitance of the insulating film to a practically acceptable value, i.e., 1 $\mu/cm^2$ or less, it is necessary to set the electron carrier concentration to $2 \times 10^{19} cm^{-3}$ or more. To do this, the overall concentration must be set to 20 atomic % or less as understood from FIG. 3.

In the second aspect of the present invention, the first conducting layer, second conducting layer, or the first and second conducting layers are a polycrystalline conducting layer. However, since the average grain diameter of at least part of the peripheral portion of concern is set to a value smaller than that of other portion, stress produced in the grain boundary in a later step such as the post gate-formation oxidation step will become small. As a result, the protrusions generated in the post gate-formation oxidation step is smaller, compared to that of conventionally formed one. Therefore, even if the insulating film is reduced in thickness more and more, an increase of the defect density generated in the peripheral portion of the insulating film will be suppressed.

In the semiconductor device according to the present invention, if at least one portion of the peripheral portion of the first and second conducting layers facing the region sandwiched between the first conducting layer and the second conducting layer is formed of an amorphous conducting layer or a polycrystalline conducting layer having an average diameter smaller than that of the other portion, the effects of the present can be obtained as mentioned above. In particular, if the entire peripheral portion has an amorphous structure or a polycrystalline structure, the remarkable effects of the present invention will be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 10A and 10B are diagrams showing the distribution of the nitrogen concentration in a floating gate electrode; FIG. 10A shows the distribution in the case of a second embodiment, and FIG. 10B is the distribution in a modified case;

FIGS. 10C and 10D show the distribution of nitrogen concentration of a control gate electrode containing nitrogen in a large amount; FIG. 10C shows a concentration change of a stepwise manner and FIG. 10D shows a moderate concentration change;

FIG. 14A is a local sectional view of a gate electrode portion, FIG. 14B is a bottom plan view of the gate electrode of FIG. 14A, looking from the gate oxide film side;

FIGS. 16A and 16B are cross sectional views of a stacked gate electrode, for explaining a basic concept according to a second aspect of the present invention (a third embodiment); FIG. 16A shows the case in which an area of small-diameter crystals is present at the upper end portion of a floating gate electrode; FIG. 16B shows the case in which an area of small diameter crystals is present at the lower end portion of a control gate electrode;

FIGS. 17A and 17B are perspective views of a stacked gate electrode, for explaining a basic concept according to a second aspect of the present invention (a third embodiment); FIG. 17A is the same view as shown in FIG. 17B except for a control electrode and an insulating film between gate electrode present in FIG. 17B;

FIGS. 20A–20E are cross sectional views, taken along the line 5—5 of FIG. 4, showing the manufacturing steps of EEPROM according to a fifth embodiment of the present invention, in a stepwise manner; and FIGS. 21A–21E are cross sectional views, taken along the line 6—6 of FIG. 4, showing the manufacturing steps of EEPROM according to a fifth embodiment of the present invention, in a stepwise manner.

DETAILED DESCRIPTION OF THE PREFERRED EMBODIMENTS

Hereinbelow, embodiments of the present invention will be explained with reference to the accompanying drawings.

(First Embodiment)

Figure 1:
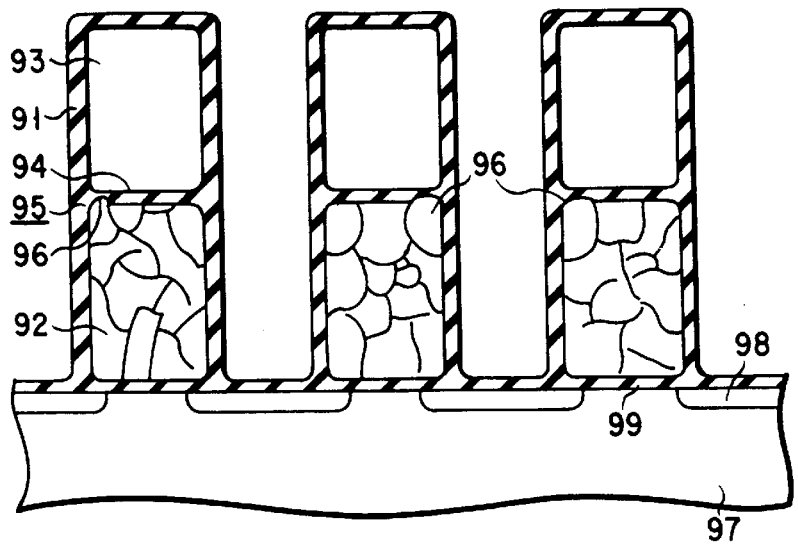
FIG. 1 is a cross sectional view of a conventional stacked electrode for explaining a phenomenon that polycrystalline silicon grains develop into protruding type grains in a floating gate electrode made of a polycrystalline silicon.
Figure 2:
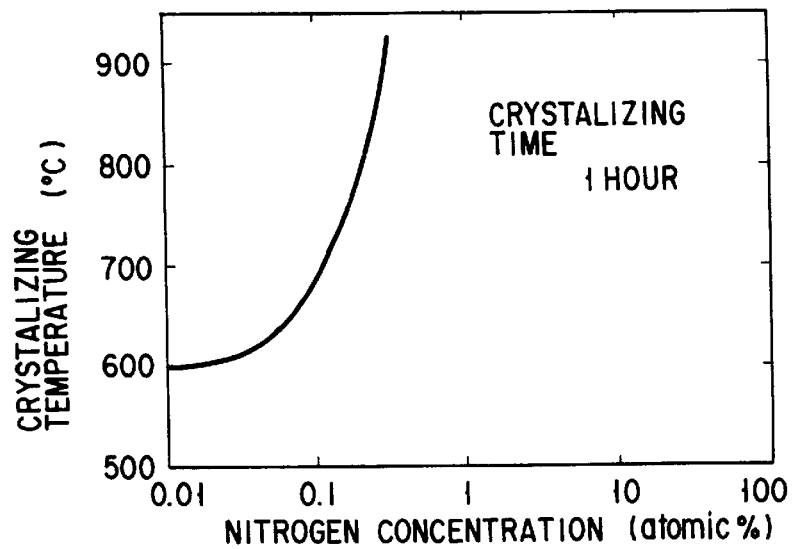
FIG. 2 is a characteristic diagram showing the relationship between the nitrogen concentration and the crystallization temperature in an amorphous silicon film according to a first aspect of the present invention.
Figure 3:
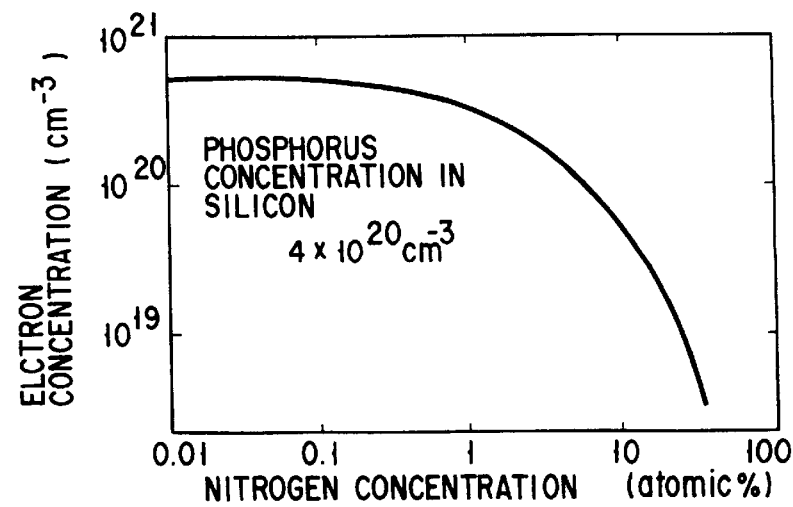
FIG. 3 is a characteristic diagram showing the relationship between the nitrogen concentration and the electron carrier concentration in an amorphous silicon film according to a first aspect of the present invention.
Figure 4:
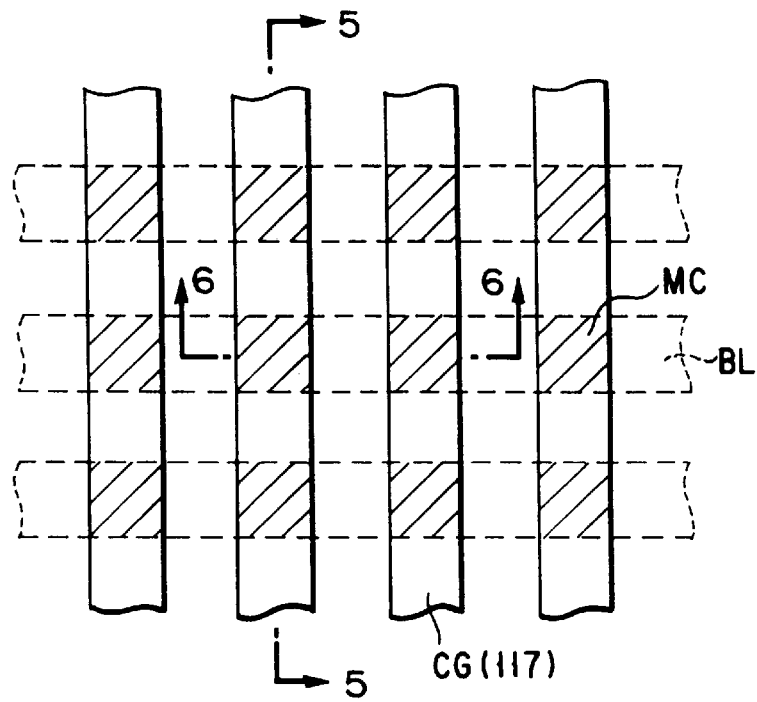
FIG. 4 is a schematic plan view of EEPROM having a general element arrangement.

FIG. 4 is a schematic plan view showing a general element arrangement of EEPROM. The symbol BL is a bit line and CG indicates a control gate line. The hatched portion MC present at the intersection of the BL line and the CG line is a memory cell.

FIGS. 5A–5D and 6A–6D are cross sectional views showing manufacturing steps of EEPROM according to a first embodiment of the present invention, in a stepwise manner. They are cross sectional views taken along the line 5—5 and the line 6—6 of FIG. 4, respectively. Steps shown in FIGS. 5A–5D correspond to those of FIGS. 6A–6D, respectively. Embodiments hereinbelow are explained on the assumption that an NAND-type EEPROM is manufactured. The same method can be applied in manufacturing other types of EEPROM.

Figure 5A:
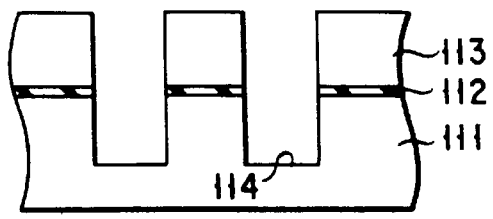
FIGS. 5A–5D are cross sectional views, taken along the line 5—5 of FIG. 4, showing manufacturing steps of EEPROM according to a first embodiment of the present invention, in a stepwise manner.
Figure 6A:
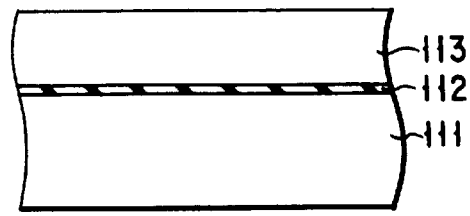
FIGS. 6A–6D are cross sectional views, taken along the line 6—6 of FIG. 4, showing manufacturing steps of EEPROM according to a first embodiment of the present invention, in a stepwise manner.

In the first place, as shown in FIGS. 5A and 6A, on the entire surface of a p-type silicon substrate 111 (e.g., resistivity: 10 Ωcm, crystalline surface (100)), a 10 nm-thick silicon oxide film 112 serving as a tunnel-gate insulating film is formed by means of a thermal oxidation method.

As a second step, on the silicon oxide film 112, a 300 nm-thick amorphous silicon film 113 serving as a floating gate electrodes is formed by means of the CVD method at 550° C., using, e.g., $SiH_4$ as a raw material gas.

Subsequently, to the amorphous silicon film 113, phosphorus and nitrogen are implanted by the ion implantation method in an amount of $5 \times 10^{20}$ $cm^{-3}$ to $1 \times 10^{21}$ $cm^{-3}$, respectively. By the ion implantation, the amorphous silicon film 113 will contain nitrogen in an amount of 2.0 atomic %. As a result, a floating gate electrode made of the amorphous silicon containing 2.0 atomic % of nitrogen can be obtained.

After a mask pattern is formed by photolithography, the amorphous silicon film 113 doped with impurities, the silicon oxide film 112 and the p-type silicon substrate 111 are etched in a sequential manner by an RIE (Reactive Ion Etching) method by using the mask pattern as a mask. As a result, a trench 114 for element separation is formed.

Figure 5B:
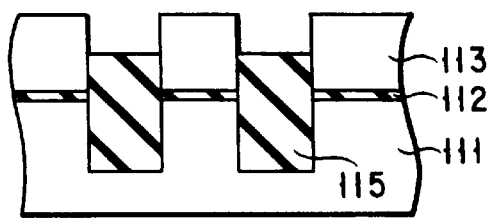
Figure 6B:
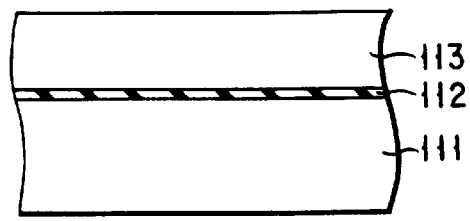

Thereafter, as shown in FIGS. 5B and 6B, a thick silicon oxide film serving as an insulating film 115 for element separation and having a thickness equal to or more than the depth (e.g., 500 nm) of the trench 114, is deposited over the entire surface. After the etching-back is carried out by an RIE method, the insulating film 115 for element separation is formed.

In this embodiment a top surface of the insulating film 115 is positioned above a top surface of the silicon oxide film 112. However, the top surface of the film 115 can be positioned under or at the same height as the top surface of the film 112.

Figure 5C:
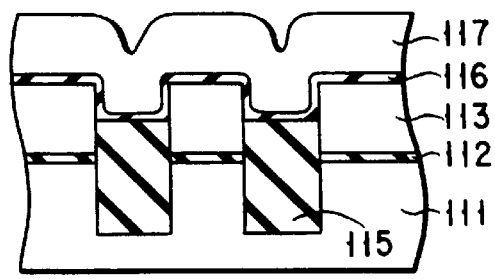
Figure 6C:
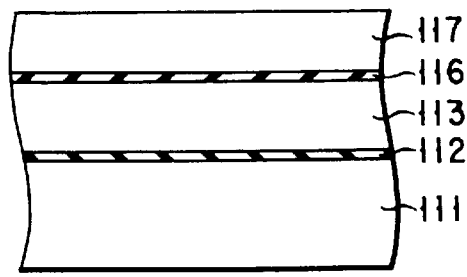

As a next step, as shown in FIGS. 5C and 6C, a 12 nm-thick thin silicon oxide film 116 serving as the insulating film between gate electrodes is formed over the entire surface. On the silicon oxide film 116, a 300 nm-thick polycrystalline silicon film 117 serving as a control gate electrode is formed by the CVD method at 600° C., using, e.g., an $SiH_4$ gas as a raw material gas. Thereafter, to the polycrystalline silicon film 117, $3 \times 10^{20} cm^{-3}$ of phosphorus is implanted by the ion implantation method.

Figure 5D:
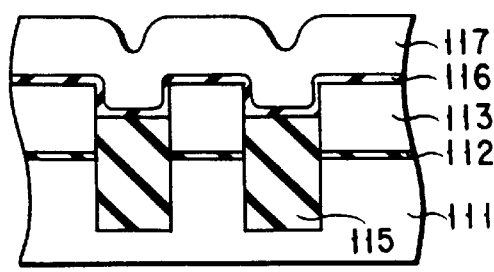
Figure 6D:
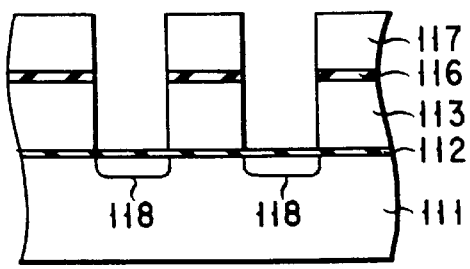

After a mask pattern is formed by photolithography, the polycrystalline silicon film 117, thin silicon oxide film 116, and polycrystalline silicon film 113 are etched by an RIE method, using the mask pattern as a mask, as shown in FIGS. 5D and 6D. As a result, a gate electrode portion (control gate electrode 117, insulating film 116 between gate electrodes, and floating gate electrode 113) is formed.

Using the control gate electrode 117 as a mask, an n-type impurity is implanted into the p-type silicon substrate 111 by the ion implantation method, thereby forming an n-type diffused region 118 in a self-aligning manner. Finally, heat treatment is performed at 900° C. in an oxygen atmosphere to activate the aforementioned impurity.

As is the case of this embodiment, the application of an amorphous silicon film doped with nitrogen ($1 \times 10^{21} cm^{-3}$) makes it possible to form the floating gate electrode 113 which will not crystallize even if exposed to a temperature as high as about 900° C. in an oxidation step performed later.

When the doping amount of nitrogen is $1 \times 10^{21} cm^{-3}$ or more, the floating gate electrode 113 will not crystallize even if exposed to a temperature as high as 900° C. or more in an oxidation step performed later or an activation step of impurities.

In this embodiment, the nitrogen-doped amorphous silicon film is formed by a nitrogen ion implantation. However, the CVD method may be employed to form the amorphous silicon film. In the case where the CVD method is employed, the amorphous silicon film is desirably formed at a pressure of 100 mTorr to 10 mTorr and a temperature of 800° to 650° C. while $SiH_2Cl_2$ and $NH_3$ gases are supplied as a raw material gas at a flow ratio of 5:1 to 1000:1. In this case, if an impurity such as $PH_3$ is simultaneously supplied as a raw material gas, the resistivity of the floating gate will be lowered.

In this embodiment, nitrogen is employed. Instead, oxygen may be used. When oxygen is used, oxygen may be doped to an amorphous silicon film by the ion implantation method, or by a CVD method using $SiH_4$ and $N_2O$ as a raw material gas.

Instead of nitrogen and oxygen, carbon, argon, chlorine or fluorine may be used. Furthermore, nitrogen, oxygen, carbon, argon, chlorine and fluorine may be used in the form of a mixture of two or more elements. In either case, the overall concentration of one, or two or more elements should fall within the range from 0.1 atomic % to 20 atomic %.

Figure 7:
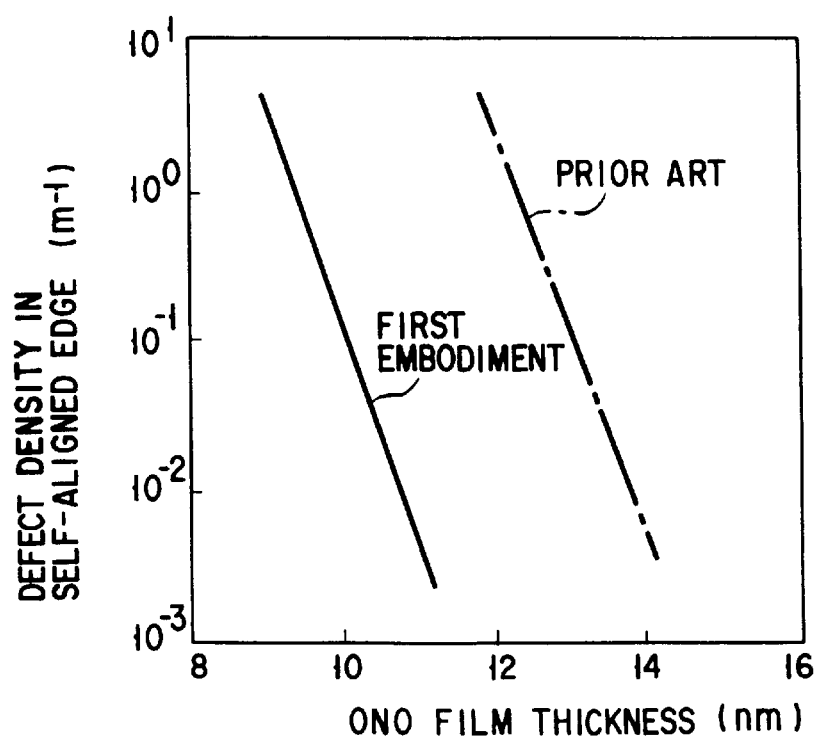
FIG. 7 is a characteristic diagram showing the relationship between the defect density and the film thickness of an ONO film of the present invention in comparison with a conventional ONO film.

FIG. 7 is a diagram showing the relationship between the defect density and film thickness of an ONO (Oxide Nitride Oxide) film used in a memory cell formed in accordance with the method of this embodiment, in comparison with a conventional memory cell in which a polycrystalline silicon is used as a floating gate electrode. As is apparent from FIG. 7, the defect density of the ONO film is sufficiently low despite that the ONO film is reduced in thickness in the memory cell of the present invention, compared to the conventional memory cell.

In the memory cell formed in accordance with this embodiment, the defect density is low. This is because no protruding type grains are developed by the application of the amorphous silicon film to the floating gate electrode even if the floating gate is oxidized in the oxidation step after gate formation, since there is no grain boundary in the amorphous silicon film.

According to this embodiment, manufacturing steps can be reduced in number, compared to the case in which single crystalline silicon is employed as a floating gate electrode. To be more specific, a step of forming a single crystal including a seed region formation step and an annealing step for crystallization, are not required, thus simplifying the manufacturing method.

(Second embodiment)

FIGS. 8A–8D and 9A–9D are cross sectional views showing manufacturing steps of EEPROM according to a second embodiment of the present invention, in a stepwise manner. FIGS. 8A–8D are cross sectional views taken along the line 5—5 of FIG. 4 and FIGS. 9A–9D are cross sectional views taken along the line 6—6 of FIG. 4.

In the first embodiment, we introduce the case in which a floating gate electrode is formed of an amorphous film in its entirety. However, the floating gate is not always necessary to be formed of the amorphous film in its entirety.

In this embodiment, at most 0.1 μm-thick region of the floating gate electrode in contact with the insulating film between gate electrodes contains 0.1 atomic % of oxygen and is made of an amorphous silicon film having no grain boundary. More specifically, the side of the floating gate facing the insulating film between gate electrodes is partially made of the amorphous silicon film.

Figure 8A:
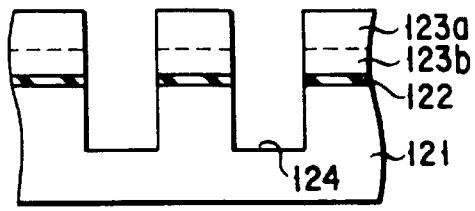
FIGS. 8A–8D are cross sectional views, taken along the line 5—5 of FIG. 4, showing manufacturing steps of EEPROM according to a second embodiment of the present invention, in a stepwise manner.
Figure 9A:
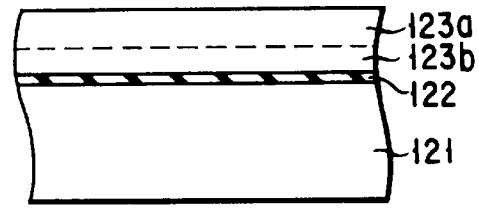
FIGS. 9A–9D are cross sectional views, taken along the line 6—6 of FIG. 4, showing manufacturing steps of EEPROM according to a second embodiment of the present invention, in a stepwise manner.

As shown in FIGS. 8A and 9A, on the entire surface of a p-type silicon substrate 121 (e.g. resistivity: 10 Ωcm, crystal surface: (100)), a 10 nm-thick silicon oxide film 122 serving as a tunnel gate insulating film is formed by a thermal oxidation method.

Then, on the silicon oxide film 122, 300 nm-thick polycrystalline silicon film serving as a floating gate electrode (amorphous silicon film 123a, polycrystalline silicon film 123b) is formed by the CVD method. The polycrystalline silicon film is formed, for example, at 600° C. by using $SiH_4$ as a raw material gas.

Thereafter, to the polycrystalline silicon film, nitrogen and phosphorus are implanted respectively in an amount of $5\times10^{20}cm^{-3}$ and $1\times10^{21}cm^{-3}$ by the ion implantation at an accelerating voltage of 40 keV. The types of elements and dozes will not be limited to the aforementioned ones and may be changed as in the same manner as mentioned in the first embodiment.

As a result, nitrogen is selectively doped only to the polycrystalline silicon film portion to a depth of 100 nm from the surface, thereby forming a 100 nm-thick amorphous silicon film 123a. Hence, the floating gate electrode is formed of the 100 nm-thick amorphous silicon film 123a and the 200 nm-thick polycrystalline silicon film 123b.

Then, a mask pattern is formed by photolithography. Using the mask pattern as a mask, the amorphous silicon film 123a, polycrystalline silicon film 123b, silicon oxide film 122, and p-type silicon substrate 121 are etched in a subsequent manner by a reactive ion etching method, to form a trench 124 for element separation.

Figure 8B:
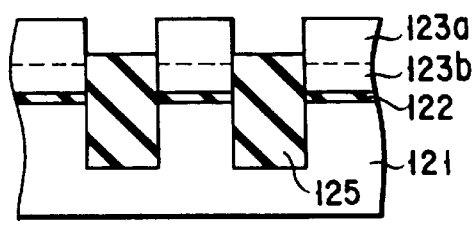
Figure 9B:
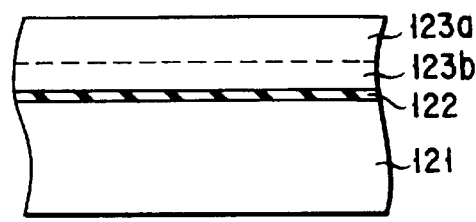

Thereafter a thick silicon oxide film serving as an insulating film 125 for element separation having a thickness equal to or more than the depth (e.g., 500 nm) of the trench 124, is deposited over the entire surface, as shown in FIGS. 8B and 9B. After etching back is performed by an RIE method, the insulating film 125 for element separation is formed.

Figure 8C:
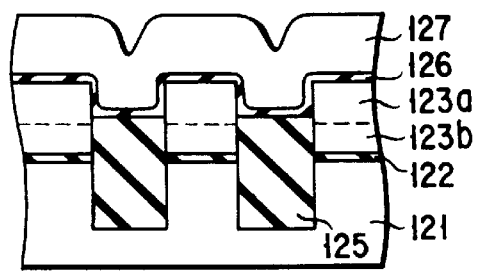
Figure 9C:
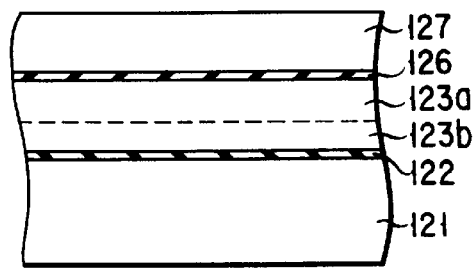

Then, as shown in FIGS. 8C and 9C, a thin silicon oxide film 126 of 12 nm-thick serving as an insulating film between gate electrodes is formed over the entire surface. Subsequently, on the silicon oxide film 126, a 300 nm-thick polycrystalline silicon film 127 serving as a control gate electrode is formed by the CVD method. The polycrystalline silicon film 127 is formed at, for example, 600° C., using $SiH_4$ as a raw material gas. Afterwards, $3\times10^{20}cm^{-3}$ of phosphorus is doped to the polycrystalline silicon film 127 by the ion implantation.

Figure 8D:
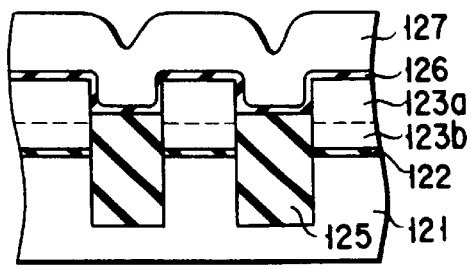
Figure 9D:

After a mask pattern is formed by photolithography the polycrystalline silicon film 127, thin silicon oxide film 126, polycrystalline silicon film 123 are etched by using the mask pattern as a mask, as shown in FIGS. 8D and 9D. As a result, a gate electrode portion (control gate electrode 27 and insulating film 126 between gate electrodes, floating gate electrode 123a and 123b) is formed.

Using the control gate electrode 127 as a mask, an n-type impurity is implanted into the p-type silicon substrate 121 by the ion implantation. Consequently, an n-type diffused region 128 is formed in a self-aligning manner. Finally, the aforementioned impurity is activated by heat treatment at 900° C. in an oxygen atmosphere.

According to this embodiment, since the floating gate electrode 123a (a floating gate electrode facing the insulating film between electrodes) is made of amorphous silicon, no protruding type grains are produced in the floating gate electrode 123a on the side facing to the insulating film between gate electrodes in the post gate-formation oxidation step. Hence, the insulating film 126 between gate electrodes can be reduced in thickness without an increase of the defect density thereof.

Furthermore, the floating gate electrode 123b facing the tunnel oxide film is made of polycrystalline silicon, a tunnel current flowing through the tunnel oxide film can be increased. This is because the barrier height of the tunnel oxide film, right under the grain boundary decreases and thereby the current density of this area increases. In this manner, the voltage required for a write/erase operation can be decreased, facilitating the miniaturization of the semiconductor element.

In this embodiment, the floating gate electrode can be formed by the CVD method. Using, for example, $SiH_4$ and $PH_3$ as a raw material gas, a phosphorus-doped polycrystalline silicon film having 200 nm in thickness is formed at a deposition temperature of 600° C. Thereafter, the CVD method is repeated at a deposition temperature as low as 550° C. by using a raw material gas to which an $NH_3$ gas is further added. As a result, a phosphorus-doped amorphous silicon film having 100 nm in thickness is formed. In this way, the floating gate electrodes 123a and 123b can be formed.

In the second embodiment, a portion of the floating gate electrode 123a is formed so as to show the same nitrogen concentration level within a preset range of the depth from the interface, as shown in FIG. 10A. The present invention is satisfied if the concentration of impurities (nitrogen and oxygen) is higher in the peripheral portion of the floating gate electrode facing the insulating film between gate electrodes than other portions. Therefore, the concentration of impurities may be the highest near the interface to the insulating film between gate electrodes and may gradually decrease as departing from the interface, as shown in FIG. 10B.

The layer having a high amount of impurities may be provided onto the side of an upper control gate electrode, as shown in FIG. 10C. This structure is made as follows: After the insulating film between gate electrodes is formed, an amorphous silicon film doped with impurities is deposited on the insulating film in a thickness of 100 nm by the CVD method. The film is formed using $SiH_4$(100 sccm) and $NH_3$ (1 sccm) at a temperature of 525° C., at a pressure of 0.3 Torr. After the nitrogen-doped amorphous silicon is deposited to 100 nm in thickness under these conditions, amorphous silicon is deposited to 100 nm in thickness under the same conditions except that $SiH_4$ gas alone is used as the raw material gas. In this case, if an $NH_3$ flow is gradually stopped but not in a stepwise manner in order to shift the raw material gas to only $SiH_4$, the distribution pattern of the nitrogen gas concentration will be obtained as shown in FIG. 10D. Thereafter, the upper portion 127b of the control gate electrode is crystallized in a heat treatment step performed later, turning to polycrystalline silicon, whereas, the lower portion 127a maintains an amorphous state.

Figures 11A, 11B, 11C:
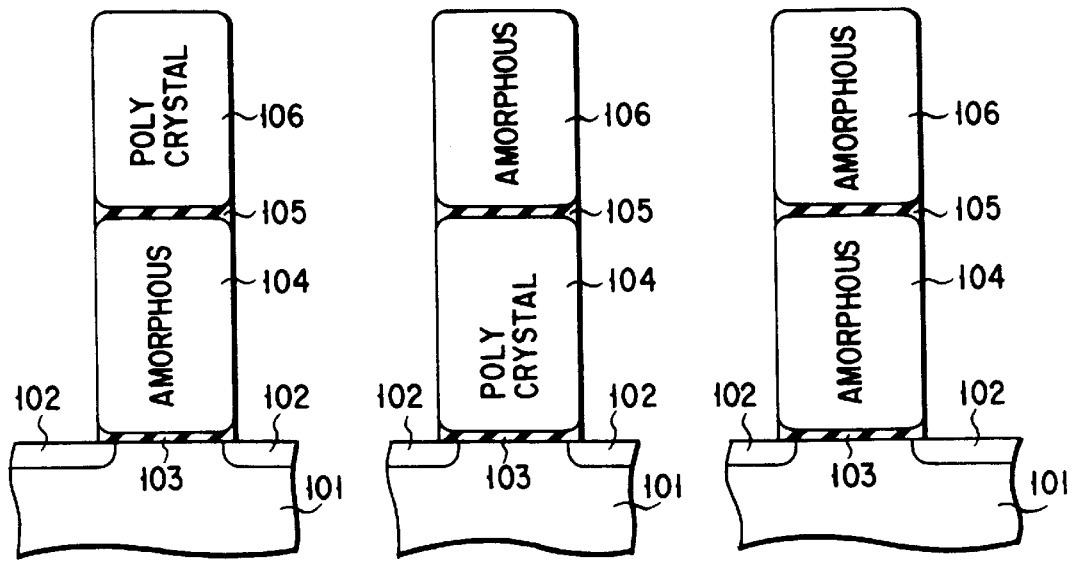
FIGS. 11A–11C are a cross sectional views showing modified embodiments of the present invention.

In the first and second embodiments, we introduce that the floating gate 104 alone is made of amorphous silicon as shown in FIG. 11A. However, the control gate electrode 106 alone may be formed of amorphous silicon as shown in FIG. 11B. Alternatively, both floating gate electrode 104 and control gate electrode 106 may be made of amorphous silicon. In FIGS. 11A–11C, the reference numerals 101, 102, 103, and 105 indicate a silicon substrate, diffusion layer, gate insulating film and an insulating film between gate electrodes, respectively.

Figure 12:
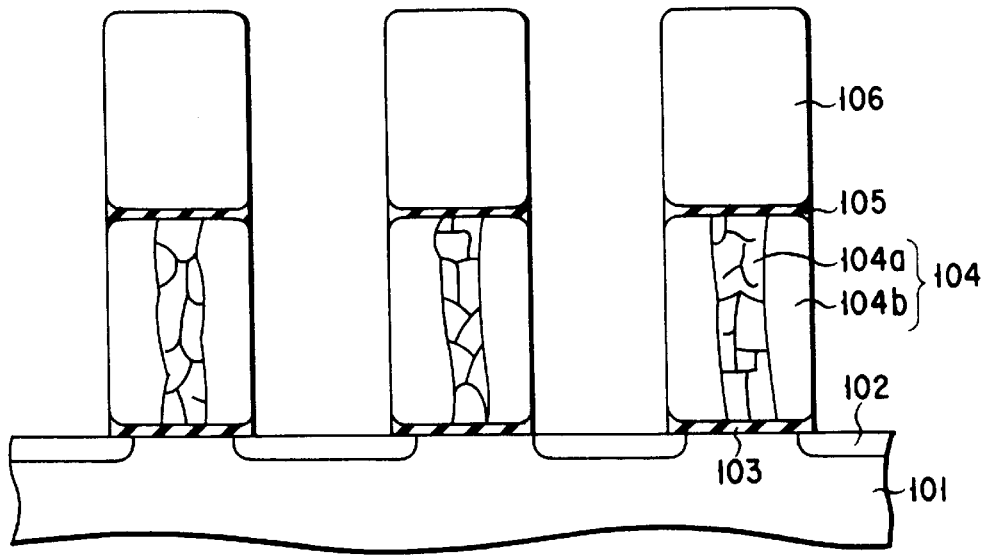
FIG. 12 shows cross sectional views showing yet another modified embodiment of the present invention.

Furthermore, as shown in FIG. 12, the entire side surface portion 104b of the floating gate electrode 104 may be made of amorphous silicon. In other words, when the floating gate electrode 104 is formed in a self aligning manner, at least the vicinity of the processed surface of the polycrystalline silicon film serving as the floating gate electrode may be amorphous. The reference numeral 104a of FIG. 12 indicates a portion of the floating gate electrode made of polycrystalline silicon.

In the aforementioned gate structure, a refractory metal such as W, Ti, W/WSi$_x$N$_y$ or a metal silicide such as WSi$_x$ or TiSi$_x$ may be deposited on the control gate electrode to a thickness of 200 to 300 nm, with the intention of reducing the resistivity of the control gate electrode 106. This modification is preferably made particularly when the control gate electrode is made of amorphous silicon as is the case of FIGS. 11B and 11C.

Figure 13:
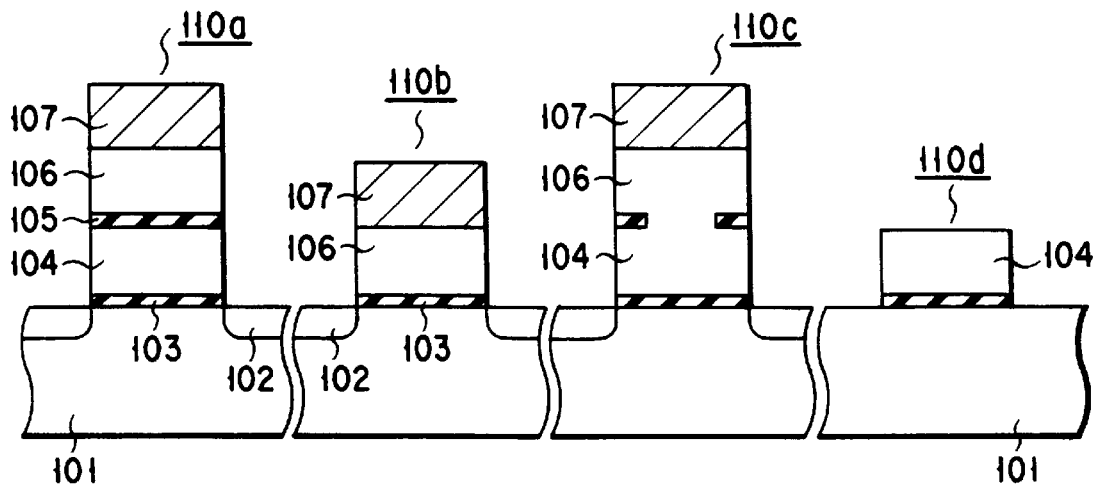
FIG. 13 is a view in which the gate electrode of the present invention is employed in forming various semiconductor elements of a memory device.

In the memory device used in practice, the structure of the control gate electrode and/or the floating gate electrode is used for forming a semiconductor element of a peripheral circuit. This case is specifically shown in FIG. 13. Reference numeral 110a shows an example of a transistor wherein a metal (metal silicide) layer 107 is formed on a double gate structure consisting of a first conducting layer (floating gate) 104 and a second conducting layer (control gate) 106. Reference numeral 110b indicates a transistor using a stacked layers of the second conducting layer 106 and the metal layer 107, as a gate electrode. Reference numeral 110c is a transistor employing, as a gate electrode, a stacked structure consisting of the first conducting layer 104, second conducting layer 106, and the metal layer 107 in a sequential order, in which layers 104 and 106 are directly coupled to each other. Reference numeral 110d is a resistance element using the first conducting layer 104.

Although, in the first and second embodiments, the floating gate electrode and the control gate electrode are used for the first and second conducting layers, respectively, a substrate and a gate electrode of a MOS transistor may be used for the first and second conducting layers, respectively.

(Third embodiment)

Figure 14A:
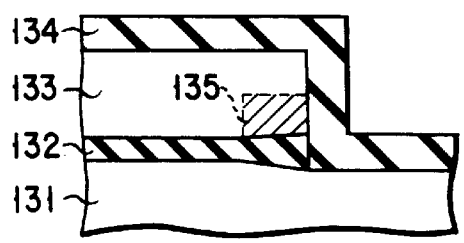
FIGS. 14A and 14B are views for explaining a basic concept according to a second aspect of the present invention (a third embodiment)
Figure 14B:
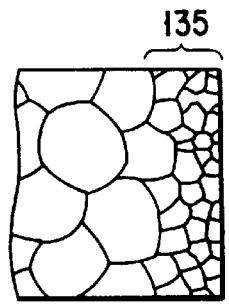

FIGS. 14A and 14B are views showing the basic concept of the second aspect of the present invention and showing an example of an MOS transistor using the present invention. FIG. 14A is a cross sectional view of the gate electrode portion of the MOS transistor. FIG. 14B is a bottom plan view showing shapes of crystal grains of the gate electrode 133 including the peripheral portion 135 thereof, looking the electrode 133 up from the side of a gate insulating film 132 of the MOS transistor.

In the figures, reference numeral 131 indicates a silicon substrate (first conducting layer) doped with impurities. On the silicon substrate 131, a gate electrode 133 (second conducting layer) is arranged with a gate insulating film 132 interposed therebetween. The side surface of the gate insulating film 132 and gate electrode 133 are covered with a post gate-formation oxide film 134.

The gate electrode 133 used herein is formed of a polycrystalline silicon film and has no amorphous silicon film, unlike the first and second embodiments. Instead, the peripheral portion 135 of the gate electrode 133, which faces the silicon substrate 131 and in which bird's beak oxidation takes place when the post gate formation oxide film 134 is formed, has grains having a smaller average diameter than that of the other portion (FIG. 14B). The smaller the average grain diameter, the better. Desirably, the value of the average grain diameter is half or less than the thickness of the polycrystalline silicon film serving as the gate electrode 133.

Accordingly, a lower level of stress is generated in the grain boundary of the peripheral portion 135 in the post gate formation oxidation step. Consistently, the size of protrusions produced in the later step is smaller than conventional ones. As a result, local occurrence of reduction in film-thickness will be suppressed in the gate insulating film 132. In addition, the increase in the defect density of the gate insulating film 132 in contact with the peripheral portion 135 can be suppressed.

Figure 15A:
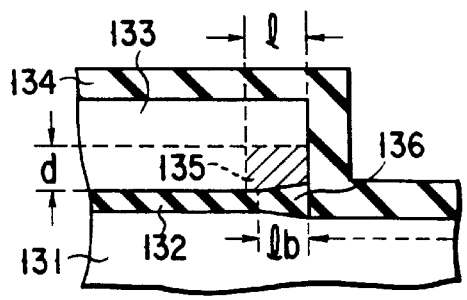
FIGS. 15A and 15B are cross sectional views of a gate electrode portion, for explaining desirable dimensions of the peripheral portion having small-diameter crystal grains.
Figure 15B:
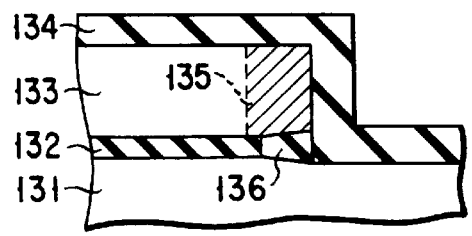

As shown in FIG. 15A, the depth l from the gate edge of the peripheral portion 135 is preferably equal to or longer than the depth lb from the gate edge of the bird's beak 136. The higher the height d of the peripheral portion 135, the better. Accordingly, height d is, most preferably, the same as the thickness of the gate electrode 133, as shown in FIG. 15B.

FIGS. 16A and 16B are cross sectional views showing a basic concept of the second aspect of the present invention.

In FIGS. 16A and 16B, reference numeral 141 indicates a silicon substrate doped with impurities. On the silicon substrate 141, a floating gate electrode 143 made of polycrystalline silicon is arranged with a tunnel insulating film 142 interposed therebetween. On the floating gate electrode 143, a control gate electrode 145 (second conducting layer) made of polycrystalline silicon is provided with an insulating film 144 interposed between gate electrodes. The control gate electrode 145, insulating film 144 between gate electrodes, floating gate electrode 143, tunnel insulating film 142 are covered with a post gate-formation oxide film 146.

In the floating gate electrode 143, as shown in FIG. 16A, the peripheral portion 147 (the peripheral portion of the electrode 143 facing the insulating film 144)in which bird's beak oxidation takes place when the post gate-formation oxide film 146 is formed, has the average grain diameter of the peripheral portion smaller than that of the other portion.

In the control gate electrode 145, as shown in FIG. 16B, the peripheral portion 148 (the peripheral portion of the electrode 144 facing the insulation film 144)in which bird's beak oxidation takes place when the post gate-formation oxide film 146 is formed, has the average grain diameter of the peripheral portion smaller than that of the other portion.

The stress generated with the growth of grains in the peripheral portions 147 and 148 in the post gate-formation oxidation step is smaller than conventional one. As a result, local occurrence of reduction in film thickness will be suppressed in the gate insulating film 144. In addition, the increase in the defect density of the gate insulating film 144 can be suppressed. Moreover, that degradation of the electron charge retaining property is prevented which is caused by an increase in a leak current of the insulating film 144 in the vicinity of grain boundary.

As is the same in the case of the peripheral portion shown in FIG. 15B, the heights of the peripheral portions 147 and 148 may be the same as the thickness of the gate electrodes 143 and 145.

It may be better that the average grain diameter of the polycrystalline silicon film, particularly, in the polycrystalline silicon film of a channel region, should not be reduced except for the region in which the bird's beak oxidation takes place. This is because if the average diameter is excessively small, an absolute value of a cell threshold voltage after the write/erase operation, will be excessively large. It is also known that the interface between the floating gate electrode and the tunnel gate insulating film right under the grain boundary is unstable and the property of the insulating film is degraded after a high temperature treatment step. In this respect, it is better not to reduce the average grain diameter.

Hence, when a portion having smaller-diameter grains is selectively provided at part or the entire portion of the peripheral portion throughout the entire film thickness of floating gate electrode, the depth l from the gate edge of the peripheral portion is preferably set equal to or slightly longer than the depth lb from the gate edge of the bird's beak.

In the foregoing, we explained a capacitance consisting of the floating gate electrode 143 (first conducting layer), insulating film 144 between electrodes, and control gate electrode 145 (second conducting layer). The same explanation can be adopted to the capacitance consisting of the silicon substrate 141 doped with impurities (first conducting layer). tunnel gate insulating film 142, and floating gate electrode 143 (second conducting layer).

The basic concept of the present invention resides in reducing the average diameter of polycrystalline silicon grains present in the portion in which the bird's beak oxidation takes place. More specifically, in the case of the floating gate electrode 143 shown in FIG. 17A, the grains present in the peripheral portion 143a is only to be reduced in size. Reference numeral 150 indicates an edge portion in which the bird's beak oxidation develops. Incidentally, FIG. 17A is the same view as FIG. 17B except that an insulating film 144 between gate electrode and the control gate electrode 145 are absent. FIGS. 16A and 16B are cross sectional view of the region sandwiched between two insulating films 149 for element separation (shown in FIG. 17B), taken along in parallel to the extending line of the insulating film 149.

Incidentally, the relation between the depth l of the peripheral portion and the height d described with respect to FIGS. 15A, 15B, 16A and 16B is applicable to the devices described in the first and second embodiments.

(Fourth embodiment)

FIGS. 18A–18E and 19A–19E show the manufacturing steps of EEPROM according to a fourth embodiment of the present invention, in a stepwise manner. They are cross sectional views taken along the lines 5—5 and 6—6 of FIG. 4, respectively. Steps shown in FIGS. 18A–18E correspond to those of FIGS. 19A–19E, respectively. This embodiment is a specific example of EEPROM to which the present invention is applied.

Figure 18A:
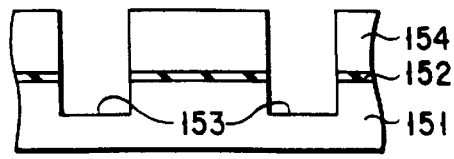
FIGS. 18A–18E are cross sectional views, taken along the line 5—5 of FIG. 4, showing the manufacturing steps of EEPROM according to a fourth embodiment of the present invention, in a stepwise manner.
Figure 19A:
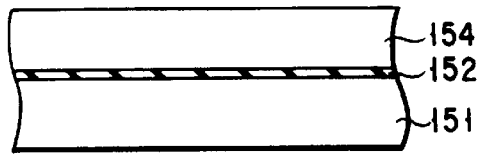
FIGS. 19A–19E are cross sectional views, taken along the line 6—6 of FIG. 4, showing the manufacturing steps of EEPROM according to a fourth embodiment of the present invention, in a stepwise manner.

As shown in FIGS. 18A and 19A, over the entire surface of a p-type silicon substrate 151 (e.g., resistivity: 10 Ωcm, crystal surface (100)), a silicon oxide film 152 of 10 nm-thick serving as a tunnel gate insulating film is formed by the thermal oxidation method.

On the tunnel gate insulating film 152, a polycrystalline silicon film 154 of 200 nm-thick serving as a floating gate electrode is formed by the CVD method. To the polycrystalline silicon film 154, phosphorus is doped in an amount of $1\times10^{20}\text{cm}^{-3}$ by, for example, the ion implantation method.

After a mask pattern is formed by photolithography, the polycrystalline silicon film 154, tunnel gate insulating film 152, and p-type silicon substrate 151 are etched in a subsequent manner, using the mask pattern as a mask. As a result, a trench 153 for element separation is formed.

Figure 18B:
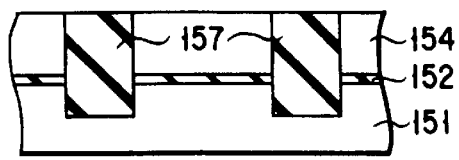
Figure 19B:
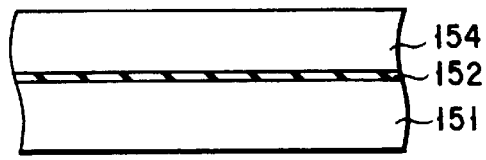

Thereafter, as shown in FIGS. 18B and 19B, a thick silicon oxide film serving as an insulating film 157 having a thickness equal to or more than the depth (e.g., 400 nm) of the trench 153, is deposited over the entire surface by the CVD method. After etching back is performed by a chemical mechanical polishing to form the insulating film 157 for element separation.

Figure 18C:
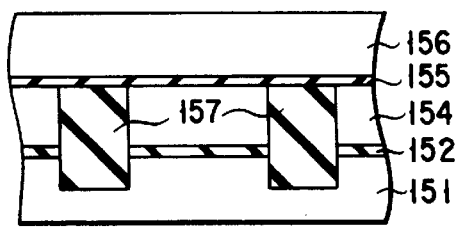
Figure 19C:
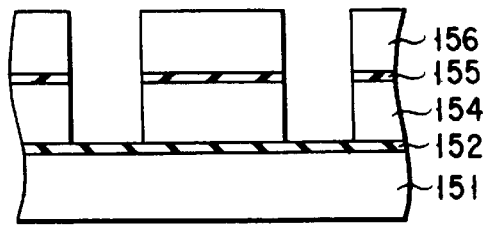

Then, as shown in FIGS. 18C and 19C, an insulating film 155 between gate electrodes is formed which has a triple-layer structure consisting of 8 nm-thick silicon oxide film, 10 nm thick silicon nitride film, and 5 nm silicon oxide film.

On the insulating film 155 between gate electrodes, a 300 nm thick polycrystalline silicon film 156 serving as a control gate electrode is formed. To the polycrystalline silicon film 156, phosphorus is doped in an amount of $3\times10^{20}\text{cm}^{-3}$ by the ion implantation method.

After a mask pattern is formed by photolithography, the polycrystalline silicon film 156, insulating film 155 between gate electrodes, and polycrystalline silicon film 154 are etched in a subsequent manner, using the mask pattern as a mask. As a result, a gate electrode portion (control gate electrode 156, insulating film 155 between gate electrodes, and a floating gate electrode 154) is formed.

Then, a native oxide film is removed by dilute hydrofluoric acid treatment, followed by heat treatment at 900° C. for 30 minutes in an argon atmosphere.

Figure 18D:
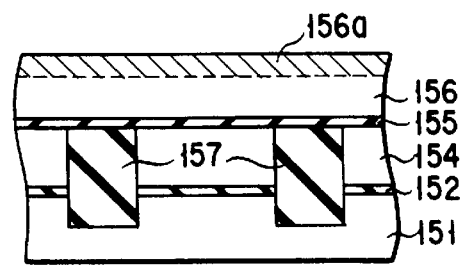
Figure 19D:
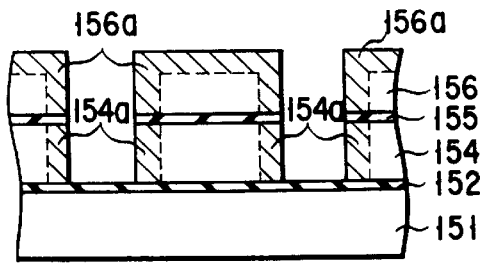

As a result of the heat treatment, as shown in FIGS. 18D and 19D, phosphorus is diffused out and low-concentration doping regions 154a and 156a having a thickness of about 30 nm are formed on the surface of the floating gate electrode 154 and the controlling gate electrode 156, respectively.

These low-concentration doping regions 154a and 156a are analyzed by an SIMS (secondary-ion mass spectroscopy) method. As a result, it was confirmed that the phosphorus concentrations of the regions 154a and 156a were $3\times10^{19}\text{cm}^{-3}$ or less and $1\times10^{20}\text{cm}^{-3}$ or less, respectively.

Figure 18E:
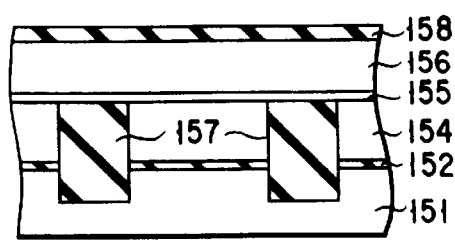
Figure 19E:
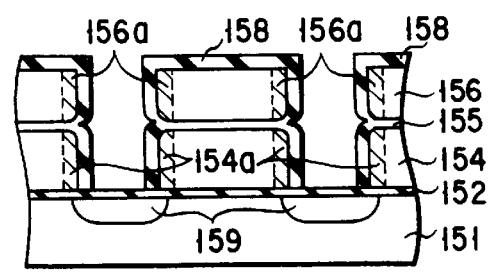

As a next step, as shown in FIGS. 18E and 19E, a post gate-formation oxide film 158 having a thickness of about 30 nm is formed on the surfaces of the floating gate electrode 154 and control gate electrode 156 by heat treatment at 900° C. for 30 minutes in an oxygen atmosphere.

Finally, using the gate electrodes 154 and 156 as a mask, arsenic is implanted into the silicon substrate 151, thereby forming an n-type diffusion layer region 159 in a self aligning manner.

According to this embodiment, the polycrystalline silicon films forming the gate electrodes 154 and 156 have crystals of a vertically cylindrical form.

When the diameters of the crystal grains are observed by a tomographic transmission electron microscope, crystal grains in the interior of the floating gate electrode 154 have an average diameter of 200 nm and crystal grains in the interior of the control gate electrode 156 have average diameter of 300 nm. However, it was confirmed that the average diameters of low-concentration doping regions 154a and 156a, that is, peripheral portions of gate electrodes 154 and 156, were as small as 100 nm, and 150 nm, respectively, since crystals grow at a low speed in the regions 154a and 156a.

According to this embodiment, the gate electrodes 154 and 156 are made of a polycrystalline silicon film. However, as the peripheral portion of concern has a smaller crystal grain diameter than the other portion, the stress generated in the grain boundary in the post gate formation oxidation step is small.

Accordingly, protrusions developed from the grains, which appear in the post gate-formation oxidation step, are smaller than the conventionally obtained ones. Even if the insulating film 155 between gate electrode is reduced in thickness, an increase of the defect density of the film 155 will be suppressed.

On the other hand, the structure of FIG. 17B can be formed by using the method of the fourth embodiment.

(Fifth embodiment)

FIGS. 20A–20E and 21A–21E show the manufacturing steps of EEPROM according to a fifth embodiment of the present invention in a stepwise manner and correspond to sectional views taken along the line 5—5 and the line 6—6 of FIG. 4, respectively.

Steps shown in FIGS. 20A–20E correspond to those of FIG. 21A–21E, respectively.

As shown in FIGS. 20A and 21A, over the entire surface of an p-type silicon substrate 161 (e.g., resistivity: 10 Ωcm, crystal surface (100)), a silicon oxide film 162 of 10 nm-thick serving as a tunnel gate insulating film is formed by the thermal oxidation method.

On the tunnel gate insulating film 162, a polycrystalline silicon film 164 of 200 nm-thick serving as a floating gate electrode is formed. To the polycrystalline silicon film 164, phosphorus is doped in an amount of $1 \times 10^{20} cm^{-3}$ by, for example, the ion implantation method.

After a mask pattern is formed by photolithography, the polycrystalline silicon film 164, tunnel gate insulating film 162, and p-type silicon substrate 161 are etched by the reactive ion etching in a subsequent manner, using the mask pattern as a mask. As a result, a trench 163 for element separation is formed.

Thereafter, as shown in FIGS. 20B and 21B, a thick silicon oxide film serving as an insulating film 167 having a thickness equal to or more than the depth (e.g., 400 nm) of the trench 163, is deposited over the entire surface by the CVD method. After etching-back is performed by a chemical mechanical polishing, the insulating film 167 for element separation is formed.

Then, as shown in FIG. 20C and 21C, an insulating film 165 between gate electrodes is formed which has a triple-layer structure consisting of 8 nm-thick silicon oxide film, 10 nm thick silicon nitride film, and 5 nm silicon oxide film.

On the insulating film 165 between gate electrodes, a 300 nm thick polycrystalline silicon film 166 serving as a control gate electrode is formed. To the polycrystalline silicon film 164, phosphorus is doped in an amount of $3 \times 10^{20} cm^{-3}$ by the ion implantation method.

After a mask pattern is formed by photolithography, the polycrystalline silicon film 166, insulating film 165 between gate electrodes, and polycrystalline silicon film 164 are etched by the ion etching method in a subsequent manner, using the mask pattern as a mask. As a result, a gate electrode portion (control gate electrode 160, insulating film 165 between gate electrodes, and a floating gate electrode 164) is formed.

Subsequently. as shown in FIGS. 20D and 21D, oxygen ions are implanted into regions 164a and 166a in the direction of an arrow 160, which has an angle of 7° C. to the substrate 161. Consequently, oxygen doped regions 164a and 166a having a thickness of about 30 nm are formed respectively on the surfaces the floating gate electrode 164 and control gate electrode 166.

As analyzed by the SIMS method, it was confirmed that the oxygen concentrations of the regions 164a and 166a were approximately 1 atomic %, which was relatively higher than the interior portion of the electrodes.

As a next step, as shown in FIGS. 20E and 21E, a post gate-formation oxide film 168 having a thickness of about 30 nm is formed on the surfaces of the floating gate electrode 164 and control gate electrode 166 by heat treatment at 900° C. for 30 minutes in an oxygen atmosphere.

Finally, using the gates 164 and 166 as a mask, arsenic is implanted into the silicon substrate 161, thereby forming an n-type diffusion layer region 169 in a self aligning manner.

According to this embodiment, the polycrystalline silicon films forming the gate electrodes 164 and 166 have crystals of a vertically cylindrical form.

When the crystal grains are observed by a tomographic transmission electron microscope, an average diameter of grains is 200 nm in the floating gate electrode 164 and 300 nm in the control gate electrode 166. However, it was confirmed that the average diameters of oxygen doped regions 164a and 166a, that is, peripheral portions of gate electrodes 164 and 166, were as small as 100 nm, and 150 nm, respectively, since crystals grow at a low speed in the regions 164a and 166a.

According to this embodiment, the gate electrodes 164 and 166 are made of a polycrystalline silicon film. However, its peripheral portion of concern has a smaller crystal grain diameter than the other portion, the stress generated in the grain boundary in the post gate formation oxidation step is small.

Accordingly, protrusions developed from the grains, which appear in the post gate-formation oxidation step, are smaller than the conventionally obtained ones. Even if the insulating film between gate electrode 165 is reduced in thickness, an increase of the defect density of the film 165 can be suppressed.

Incidentally, the construct of FIG. 17B can be formed by using the method of the fifth embodiment.

As described in the foregoing, according to the first aspect of the present invention, since at least one of a first conducting layer and a second conducting layer is an amorphous conducting layer, the grain boundary, which is a cause of an increase of the defect density, is reduced. Therefore, the increase of the defect density accompanied by the reduction of the insulating film can be suppressed.

Furthermore, according to the second aspect of the present invention, although at least one of the first and second conducting layers is a polycrystalline conducting layer, its peripheral portion of concern has an average grain diameter smaller than the other portion, the stress generated in the grain boundary in the post gate-formation oxidation step is reduced. Hence, an increase of the defect density accompanied by the reduction in thickness of the insulating film can be suppressed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a first conducting layer;
   a first insulating layer formed on said first conducting layer and defining a first interface between said first conducting layer and said first insulating layer;
   a second conducting layer formed on said first insulating layer and facing said first conducting layer and defining a second interface between said second conducting layer and said first insulating layer;

wherein:

at least one of said first and second conducting layers at a respective of said first and second interfaces with said first insulating layer includes an amorphous conducting layer made of a semiconductor and the rest of said at least one of said first and second conducting layers comprises a polycrystalline semiconductor; and said amorphous conducting layer contains at least one element selected from the group consisting of oxygen, nitrogen, carbon, argon, chlorine, and fluorine and a total concentration of said at least one element falls within a range from 0.1 to 20 atomic %.

2. The semiconductor device according to claim 1, wherein said peripheral portions of regions of said first and said second conducting layer, in contact with said first insulating layer, includes said amorphous conducting layer.

3. The semiconductor device according to claim 1 further comprising a third conducting layer formed on said second conducting layer, wherein said third conducting layer is formed of one of a refractory metal and a silicide thereof.

4. The semiconductor device according to claim 1, wherein said semiconductor is silicon and said at least one of said first and said second conducting layer is formed of silicon.

5. The semiconductor device according to claim 1, further comprising:

a semiconductor substrate on which said first conducting layer is formed;

second insulating layers for element isolation formed along both sides of said first conducting layer and at least partly embedded in said semiconductor substrate so as to sandwich said first conducting layer in one direction parallel to said semiconductor substrate; and fourth conducting layers formed along both sides of said first conducting layer in said semiconductor substrate so as to sandwich said first conducting layer in a direction perpendicular to said one direction where said second insulating layers sandwich said first conducting layer;

wherein said amorphous conducting layer is included in a region on both ends of at least one of said first and said second conducting layer in said direction perpendicular to said one direction and in contact with said first insulating layer.

6. The semiconductor device according to claim 5, wherein said second insulating layers are buried in trenches formed in a stacked layer comprising said first conducting layer, said first insulating layer, and said semiconductor substrate, said second insulating layers each having a bottom in said semiconductor substrate.

7. The semiconductor device according to claim 5, wherein said first insulating layer includes portions extending along side walls of said first conducting layer and in contact with said second insulating layers which are at least partly embedded in said semiconductor substrate, and wherein said second conducting layer includes portions extending along said side walls of said first conducting layer with said portions of said first insulating layer extending along said side walls of said first conducting layer interposed therebetween and in contact with said second insulating layers.

8. The semiconductor device according to claim 1, wherein said first conducting layer is used as a floating gate electrode and said second conducting layer is used as a control gate electrode.

9. A semiconductor device comprising:

a first conducting layer;

a first insulating layer formed on said first conducting layer; and a second conducting layer formed on said first insulating layer and facing said first conducting layer;

wherein at least one conducting layer of said first and said second conducting layers is formed of a polycrystalline conducting layer, and at least part of a peripheral portion of said at least one conducting layer, at an interface between said at least one conducting layer and said first insulating layer, contains a polycrystalline structure having an average grain diameter smaller than that of any other region of said at least one polycrystalline conducting layer.

10. The semiconductor device according to claim 9, wherein said region is included in said first conducting layer.

11. The semiconductor device according to claim 9, wherein said region is included in said second conducting layer.

12. The semiconductor device according to claim 9, wherein said region is included in each of said first conducting layer and said second conducting layer.

13. The semiconductor device according to claim 9, further comprising a third conducting layer formed on said second conducting layer, wherein said third conducting layer is formed of one of a refractory metal and a silicide thereof.

14. The semiconductor device according to claim 9, further comprising:

a semiconductor substrate on which said first conducting layer is formed;

second insulating layers for element isolation formed along both sides of said first conducting layer and at least partly embedded in said semiconductor substrate so as to sandwich said first conducting layer in one direction parallel to said semiconductor substrate; and fourth conducting layers formed along both sides of said first conducting layer and embedded in said semiconductor substrate so as to sandwich said first conducting layer in a direction perpendicular to said one direction;

wherein said polycrystalline structure is included in a region on both ends of at least one of said first and said second conducting layer in said direction perpendicular to said one direction and in contact with said first insulating layer.

15. The semiconductor device according to claim 14, wherein said second insulating layers are buried in trenches formed in a stacked layer comprising said first conducting layer, said first insulation layer, and said semiconductor substrate, said second insulating layers each having a bottom in said semiconductor substrate.

16. The semiconductor device according to claim 14, wherein said first insulating layer includes portions extending along side walls of said first conducting layer and in contact with said second insulating layers which are at least partly embedded in said semiconductor substrate, and wherein said second conducting layer includes portions extending to said side walls of said first conducting layer with said portions of said first insulating layer extending along said side walls of said first conducting layer interposed therebetween and in contact with said second insulating layers.

17. The semiconductor device according to claim 9, wherein said first conducting layer is used as a floating gate electrode and said second conducting layer is used as a control gate electrode.

18. The semiconductor device according to claim 9, wherein a value of said smaller average grain diameter is a half or less of a thickness of at least one of said first and said second conducting layer.

19. A semiconductor device comprising:

a first conducting layer;

a first insulating layer formed on said first conducting layer; and a second conducting layer formed on said first insulating layer and facing said first conducting layer;

wherein only a peripheral portion of a region, of at least one of said first and second conducting layers, at an interface between said at least one of said first and second conducting layers and said first insulating layer, includes an amorphous conducting layer made of a semiconductor, and said amorphous conducting layer contains at least one element selected from the group consisting of oxygen, nitrogen, carbon, argon, chlorine and fluorine, and a total concentration of said at least one element falls within a range from 0.1 to 20 atomic %.

20. A semiconductor device comprising:

a first conducting layer;

a first insulating layer formed on said first conducting layer; and a second conducting layer formed on said first insulating layer and facing said first conducting layer;

wherein at least one conducting layer of said first and said second conducting layers is formed of a polycrystalline conducting layer, and only a peripheral portion of said at least one conducting layer formed of said polycrystalline conducting layer, at an interface facing the other conducting layer and in contact with said first insulating layer, contains a polycrystalline structure having an average grain diameter smaller than that of any other interface, which contacts said first insulating layer, of said at least one polycrystalline conducting layer.

* * * * *